United States Patent
Chen et al.

(10) Patent No.: US 7,486,391 B2
(45) Date of Patent: Feb. 3, 2009

(54) SYSTEM AND METHOD FOR HAZE CONTROL IN SEMICONDUCTOR PROCESSES

(75) Inventors: Xiaoming Chen, Austin, TX (US);
Maihan Nguyen, Austin, TX (US);
Osamu Arasaki, Austin, TX (US);
Tammy Maraquin, Austin, TX (US);
Daniel Sawyer, Pflugerville, TX (US);
Pedro Morrison, Austin, TX (US)

(73) Assignees: Samsung Austin Semiconductor, L.P., Austin, TX (US); Samsung Electronics Co., Ltd., Suwon-si (KR)

( * ) Notice: Subject to any disclaimer, the term of this patent is extended or adjusted under 35 U.S.C. 154(b) by 143 days.

(21) Appl. No.: 11/520,538

(22) Filed: Sep. 13, 2006

(65) Prior Publication Data
US 2008/0062414 A1  Mar. 13, 2008

(51) Int. Cl.
*G01N 21/00* (2006.01)
(52) U.S. Cl. .................. 356/237.1; 356/237.4
(58) Field of Classification Search ... 356/237.1–237.6, 356/630, 243.7; 250/372, 492.2, 492.22; 438/14–18; 702/35, 81, 83
See application file for complete search history.

(56) References Cited

U.S. PATENT DOCUMENTS

| | | | | |
|---|---|---|---|---|
| 5,383,018 A | * | 1/1995 | Sadjadi | 356/243.4 |
| 5,464,779 A | * | 11/1995 | Fujimaki | 438/16 |
| 5,991,699 A | * | 11/1999 | Kulkarni et al. | 702/83 |
| 7,038,773 B2 | * | 5/2006 | Kuhlmann et al. | 356/237.4 |
| 7,251,033 B1 | * | 7/2007 | Phan et al. | 356/432 |
| 7,271,921 B2 | * | 9/2007 | Shortt | 356/630 |
| 7,304,310 B1 | * | 12/2007 | Shortt et al. | 250/372 |

FOREIGN PATENT DOCUMENTS

| | | |
|---|---|---|
| JP | 2001-091451 | 4/2001 |
| JP | 2006-145778 | 6/2006 |
| KR | 1019990057923 | 7/1999 |

OTHER PUBLICATIONS

Jerry X. Chen et al., "Haze defect control and containment in a high volume DRAM manufacturing environment", 25TH Annual BACUS Symposium on Photomask Technology, Proc. Of SPIE, vol. 5992, (2005), 11 pages.

* cited by examiner

*Primary Examiner*—Sang Nguyen

(57) ABSTRACT

A method for haze control on a semiconductor reticle, the method including performing a reticle inspection of a semiconductor reticle to detect haze formation on a periodic basis, performing a wafer inspection to detect haze defects, forecasting haze formation, and cleaning the semiconductor reticle. Also included is a haze forecasting method for haze control on a semiconductor reticle, including scanning a plurality of semiconductor wafers, identifying repeating defects in the semiconductor wafers, storing the repeating defects in a database as known repeating defects, and identifying an additional repeating defect that is not a known repeating defect, the additional repeating defect caused by semiconductor reticle haze.

19 Claims, 7 Drawing Sheets

SYSTEM AND METHOD FOR HAZE CONTROL IN SEMICONDUCTOR PROCESSES

TECHNICAL FIELD OF THE INVENTION

The present invention relates generally to the field of semiconductor manufacturing processes and, more particularly, to apparatus and methods for haze control in semiconductor reticles.

BACKGROUND OF THE INVENTION

The continual demand for enhanced integrated circuit performance has resulted in, among other things, a dramatic reduction of semiconductor device geometries, and continual efforts to optimize the performance of every substructure within any semiconductor device. As smaller dimension DRAM come into full production, haze and other progressive reticle defects have become more prevalent and costly in the semiconductor industry. These problems arise due to several factors, which include the use of shorter exposure wavelengths that produce highly energized photons as well as other environmental sources in a manufacturing facility. Some of the contaminants have been identified as cyanuric acid and ammonium sulfate, but the true mechanisms for formation of haze may have multiple possible causes and still need further research.

Fortunately, even though haze defects are dynamic and can develop quickly, the formation can be cleaned. The current challenge in a production facility is how to detect and control the haze defects without interfering with mass production.

While the possible sources and origins of the haze defect are still being investigated, it is desirable to limit the loss accompanying these defects. One method of detection is to inspect reticles and wafers frequently for development of haze defects; however, it is ineffective to solely rely on inspection without any logical system in place to calculate an accurate sampling method of reticle and wafer inspection. In addition to having a well-operated system, it is also desirable to embrace practicality by making the system cost-effective and ensure that it does not hinder production capacity. Further, studies have shown that formation of progressive defects including haze is significantly greater as the wavelength in use decreases.

As a result, there is a need for a system and method for haze control in semiconductor processes.

SUMMARY OF THE INVENTION

One embodiment provides a method for haze control on a semiconductor reticle, the method including performing a reticle inspection of a semiconductor reticle to detect haze formation on a periodic basis, performing a wafer inspection to detect haze defects, forecasting haze formation, and cleaning the semiconductor reticle.

Another embodiment provides a haze forecasting method for haze control on a semiconductor reticle, including scanning a plurality of semiconductor wafers, identifying repeating defects in the semiconductor wafers, storing the repeating defects in a database as known repeating defects, and identifying an additional repeating defect that is not a known repeating defect, the additional repeating defect caused by semiconductor reticle haze.

Another embodiment provides a haze control method for haze control on a semiconductor reticle, comprising performing an initial inspection of a reticle, loading the reticle into a tool, loading initial values from system server modules, calculating tracking dose values for a semiconductor process run, summing the initial values and the tracking dose values to produce updated dose values, and storing the updated dose values.

Other features and advantages of the present invention will be apparent to those of ordinary skill in the art upon reference to the following detailed description taken in conjunction with the accompanying drawings.

BRIEF DESCRIPTION OF THE DRAWINGS

For a better understanding of the invention, and to show by way of example how the same may be carried into effect, reference is now made to the detailed description of the invention along with the accompanying figures in which corresponding numerals in the different figures refer to corresponding parts and in which.

DETAILED DESCRIPTION OF THE INVENTION

While the making and using of various embodiments of the present invention are discussed in detail below, it should be appreciated that the present invention provides many applicable inventive concepts, which can be embodied in a wide variety of specific contexts. Although described in relation to exemplary apparatus and methods, the teachings and embodiments of the present invention may be beneficially implemented with a variety of semiconductor process applications. The specific embodiments discussed herein are, therefore, merely demonstrative of specific ways to make and use the invention, and do not limit the scope of the invention.

Various embodiments include a practical method to control the haze defects in a high volume DRAM manufacturing environment by integrating reticle cleaning with reticle and wafer inspections along with a dose-based and time-based control forecast software system. This strategy is effective in controlling the haze defects and minimizes the yield loss while still supporting the high volume production in the facility.

When a newly arrived reticle comes into the fab at SAS, it goes through the reticle incoming qualification process that includes visual bright inspection, reticle die to die inspection with the Lasertec MD2 100, and contamination inspection on the KLA STARlight before being introduced into the line. The reticle is then used to process three assigned production lots, one of which is used for KLA wafer inspection. Once the wafer inspection result and the yield on the three lots have been verified, the reticle receives the production status and can be fully utilize in the production flow. When the reticle is in production, it is immediately put into the quality control system and subjected to regular inspection every 14 days.

Figure 1:
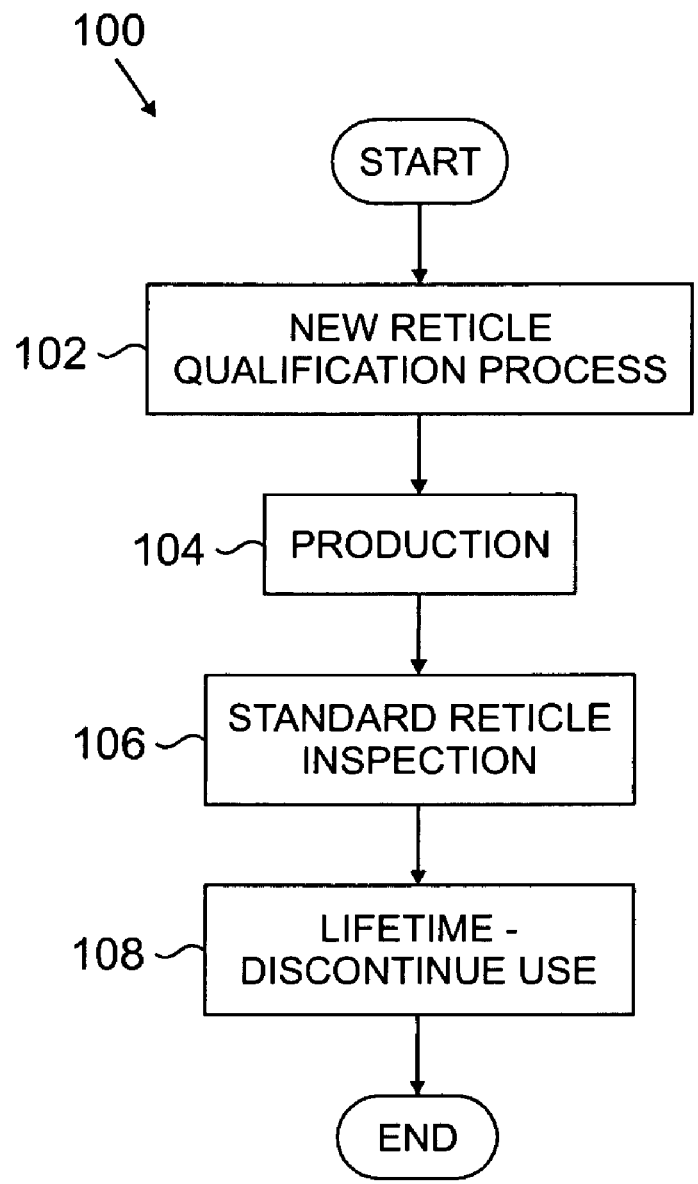
FIG. 1 illustrates a flow chart of a reticle quality control system process.

FIG. 1 illustrates a flow chart of a reticle quality control system process. Here, after a new reticle is qualified using a conventional new reticle qualification process (step 102), it is entered into semiconductor production (step 104). Periodically, such as every 14 days, the reticle undergoes a standard reticle inspection (step 106), and if it passes, it returns to production (at step 104). If not, its lifetime is expended and the reticle is discontinued (step 108).

A process such as that depicted in FIG. 1 produces generally satisfactory results until haze defects emerge. Haze defects grow rapidly with exposure dose and cause massive yield loss within days in a high volume DRAM manufacturing environment. By the time the reticle quality control system process of FIG. 1 can detect and react to the defect, the damage has already been detrimental to inline materials and some finished products.

Figure 2:
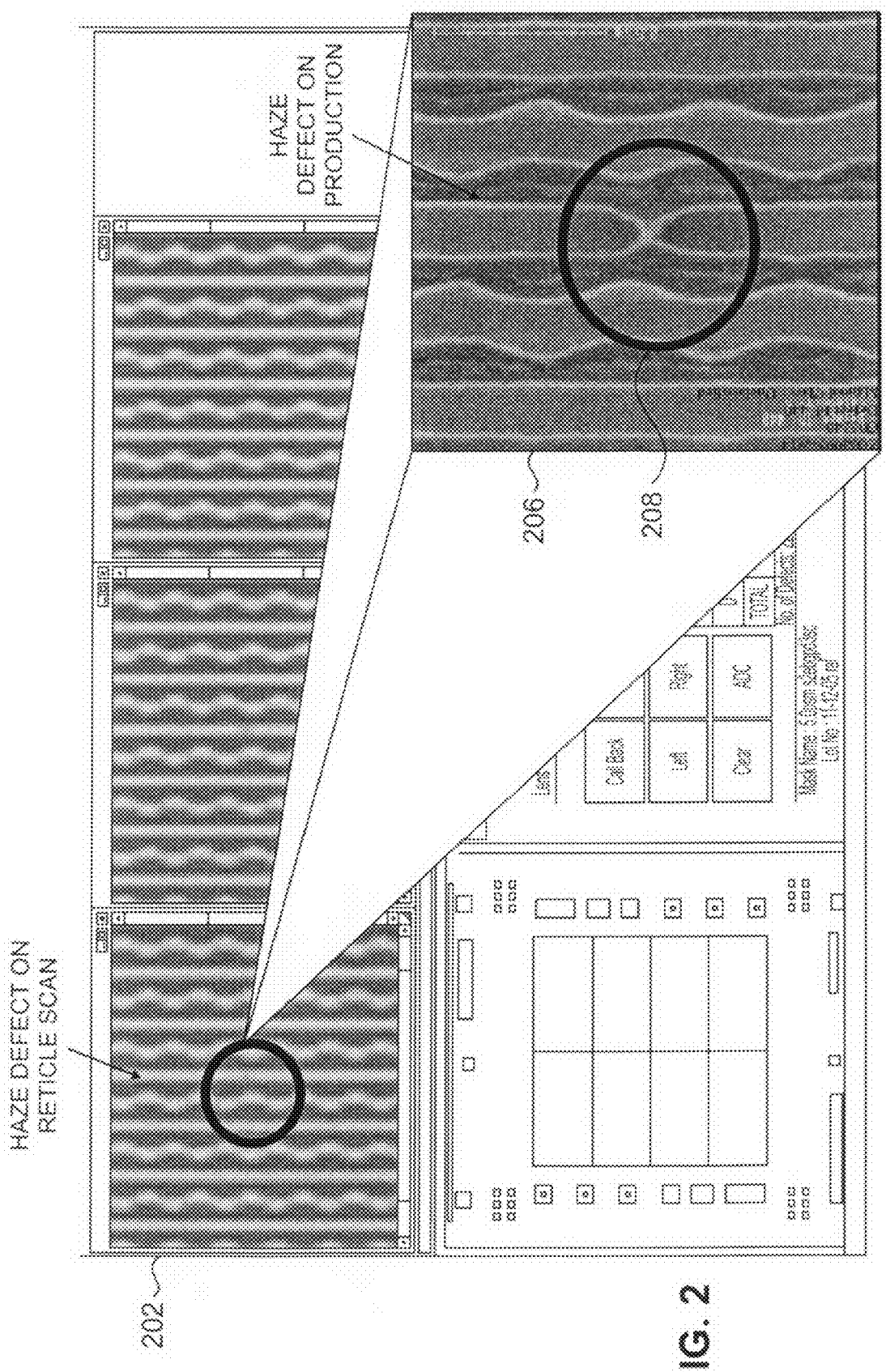
FIG. 2 depicts an example of a reticle haze defect detected in the fabrication plant.

FIG. 2 depicts an example of a reticle haze defect detected in the fabrication plant. In this figure, the reticle haze defect can be seen on reticle scan 202 at location 204, and on production wafer 206 at location 208.

In order to control the haze defects, one disclosed embodiment includes a haze control system that includes a dose-based and time-based clean forecasting system, a reticle cleaning system, and a wafer inspection method designed for haze defects.

Figure 3:
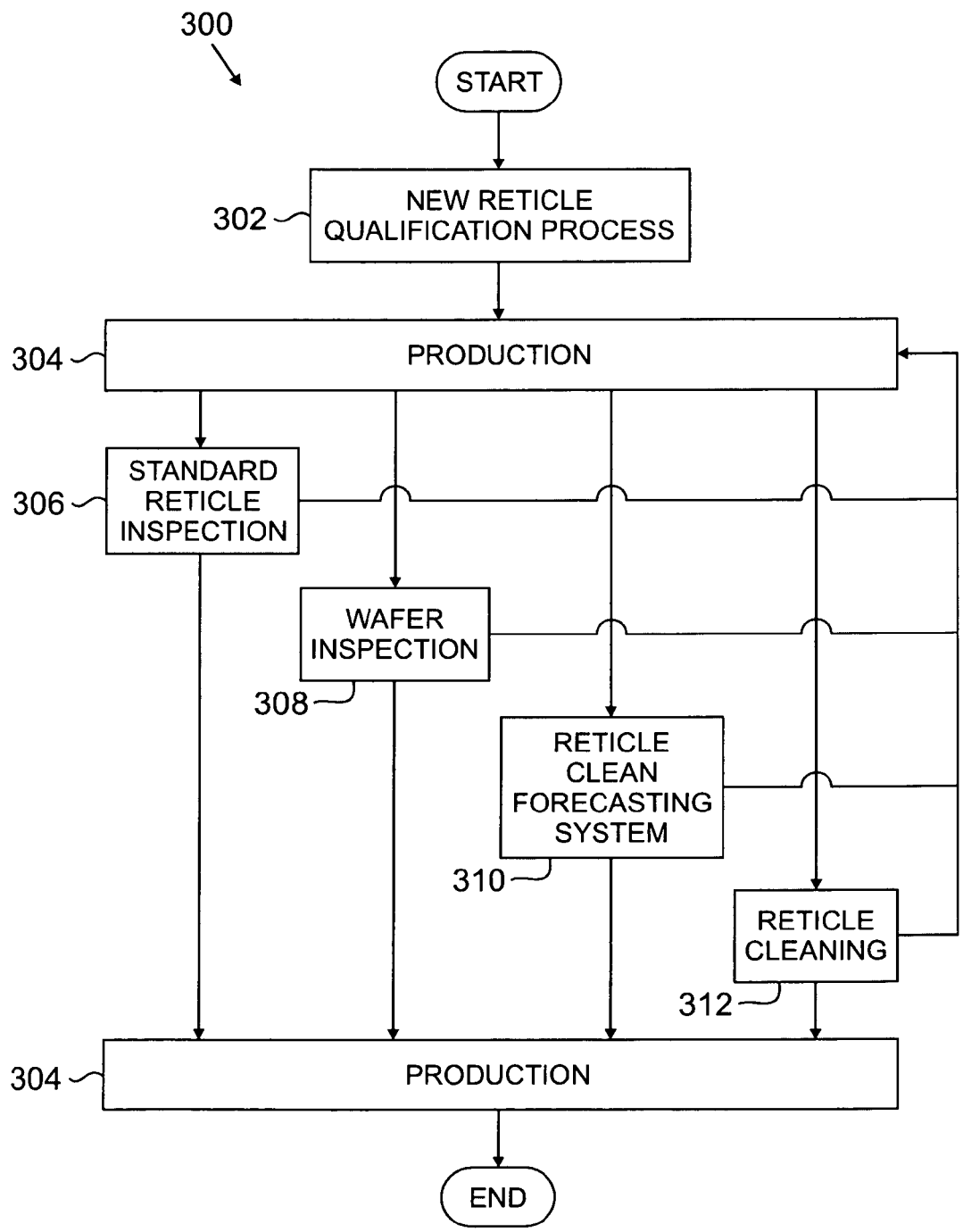
FIG. 3 shows a flow chart of a reticle quality control system 300 with the including haze control components in accordance with a disclosed embodiment.

FIG. 3 shows a flow chart of a reticle quality control system 300 with the including haze control components in accordance with a disclosed embodiment. Here, after a new reticle is qualified using a conventional new reticle qualification process (step 302), it is entered into semiconductor production (step 304). Periodically, such as every 14 days, the reticle undergoes a standard reticle inspection (step 306). Concurrently, there is a periodic wafer inspection (step 308), designed to detect haze defects, a reticle clean forecasting system (step 310), and a reticle cleaning process (step 312). According to one or more of these, the reticle is returned to production (at step 304). Alternately, according to the results of these processes, the reticle lifetime is expended and the reticle is discontinued (step 314).

In various embodiments, one or more of steps 306, 308, 310, 312 may be omitted, according to the implementation.

In some embodiments, the reticle clean forecast system at step 310 is a time-based and dose-based control system that calculates the accumulative dose exposed and time in production of the reticles. A dynamically generated clean forecasting webpage can capture and display the current dose and time in use for each reticle. In some embodiments, this forecast is divided into four levels and dictates when the reticles need cleaning based on specification details. The cleaning specifications can be defined based on the previous history and could be adjusted depending on the changes due to the process, device and production conditions.

In some cases, a well-controlled cleaning system at step 312 is used to clean the reticles. After cleaning, each reticle can be put through an inspection process and other qualification procedures before being released back to production. The dose and time accumulation of the reticle in the clean forecast system are reset to zero after the clean. The progressive growth due to dosage and chemical impurities is controlled by this preventive periodic cleaning. In the case of high volume and high inventory situations, and the reticle over the dose or time specifications cannot be released from wafer production for clean, they would be placed on an elevated alert category for daily inspection of haze defects until it is possible to clean the reticle.

On the wafer level, various embodiments include modifications to conventional wafer inspection methodology to integrate early stage haze detection capability at step 308. These improvements permit effective monitoring of all reticle repeater defects without increasing the frequency of inspection. Improved wafer inspection scan recipes incorporate software developments that permit better analysis of scan results and tracking for known reticle defects.

Disclosed embodiments that integrate the haze control system to the reticle quality control system enable the haze defects to be detected in the very early stage or prevented from developing due to the frequent cleans. In disclosed embodiments, the impact of progressive defects to wafer yield can be controlled to a minimal level without creating disruptions to the number and rate of production.

Some embodiments include improved wafer inspection techniques for the detection of haze. These techniques combine one or more of reticle-based sampling, haze wafer inspection, repeater defects filtering, and known-repeater database.

Reticle-based sampling: Traditional sampling according to a defined 'skip rule', known to those of skill in the art, has focused on equipment-based monitoring for process control. However, for the purpose of haze monitoring, the item to be monitored is the reticle rather than the equipment itself since reticles are commonly moved between tools. Disclosed embodiments allow instead either a reticle-based counter or an equipment-based counter for any particular skip rule. The counter can be either lot-based or time-based, or a combination of both, to allow for the greatest flexibility in the monitoring system.

A skip rule according to some disclosed embodiments, with the capability of reticle-based counters to establish a reticle-base sample plan for a unique reticle ID, includes several factors. These can include a trigger step, which is the photolithic main process step to be monitored, a dependent step, which is the haze scan at the wafer inspection step, and a limit count, which is the maximum number of lots a given reticle is allowed to process between inspections. The factors can also include a limit time, the maximum elapsed time between reticle inspections, and other tool-specific factors, which include the option to sample the wafer lot based on the reticle or equipment used at the trigger step.

Haze Wafer Inspection: Due to the location and the nature of the haze defects, conventional wafer inspection is not robust to detect the early stage of haze formation. Various embodiments include new scan recipes that better identify the haze defects on the wafer level. The discussion below compares some aspects of a standard wafer inspection to some aspects of a haze wafer inspection that has been optimized to detect the haze defects.

Care Area: In a conventional process, random/array inspection and care area size are optimized for the layer to be inspected and the defects of interest to be detected. In some disclosed embodiments, a random inspection mode is used to inspect the entire die and the care area is moved to the extreme edge of the die to capture the haze formation weakpoint, which typically can be at the corner of the reticle field).

Signal to Noise: In conventional processes, the signal to noise ratio can be maximized to eliminate false counts. In some disclosed embodiments, moderate amounts of false counts are tolerated on the scan results and, in some embodiments, are filtered out by a software-based repeater algorithm.

Sensitivity: In conventional systems, the scan recipe sensitivity can be optimized to detect defects of interest. In some disclosed embodiments, the scan recipe sensitivity is maximized for the earliest possible signal of the presence of haze formation.

Sample Plan: In conventional systems, the entire wafer is scanned. In some disclosed embodiments, only full-shots are scanned in these embodiments, rather than scanning partial-shots at the wafer edge. Sampling as few as 10 shots has proven to provide reasonable detection of haze formation.

Defect Review: In conventional systems, random sample of defects are classified by microscope or SEM review. In some disclosed embodiments, new repeater defects are isolated from known repeater defects so that only new repeater defects are classified by SEM review.

Figure 4:
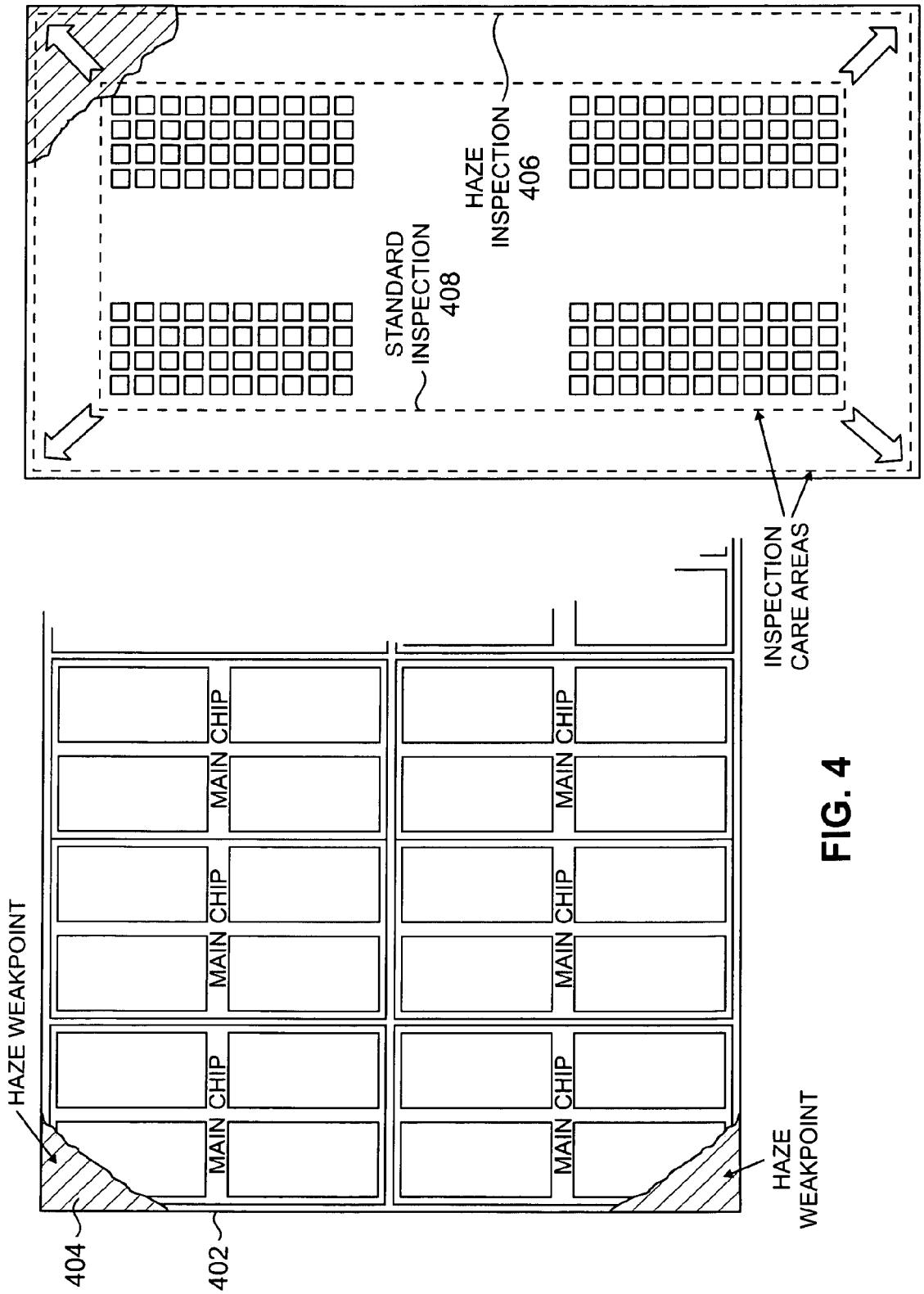
FIG. 4 illustrates the haze wafer inspection in accordance with some disclosed embodiments as compared to standard inspection on a chip.

FIG. 4 illustrates the haze wafer inspection in accordance with some disclosed embodiments as compared to standard inspection on a chip. The expanded inspection area of wafer 402 includes the corner areas 404 where the haze defects have been known to grow first. The new wafer inspections are capable of detecting haze before significant yield loss is realized. Haze inspection area 406 according to some disclosed embodiments is significantly larger than the standard inspection area 408.

Reticle repeater filtering and known repeater database: A haze inspection process in accordance with various embodiments includes the capability to separate repeating defects from the noise, or false defects, which also present on the scan results.

Figure 5:
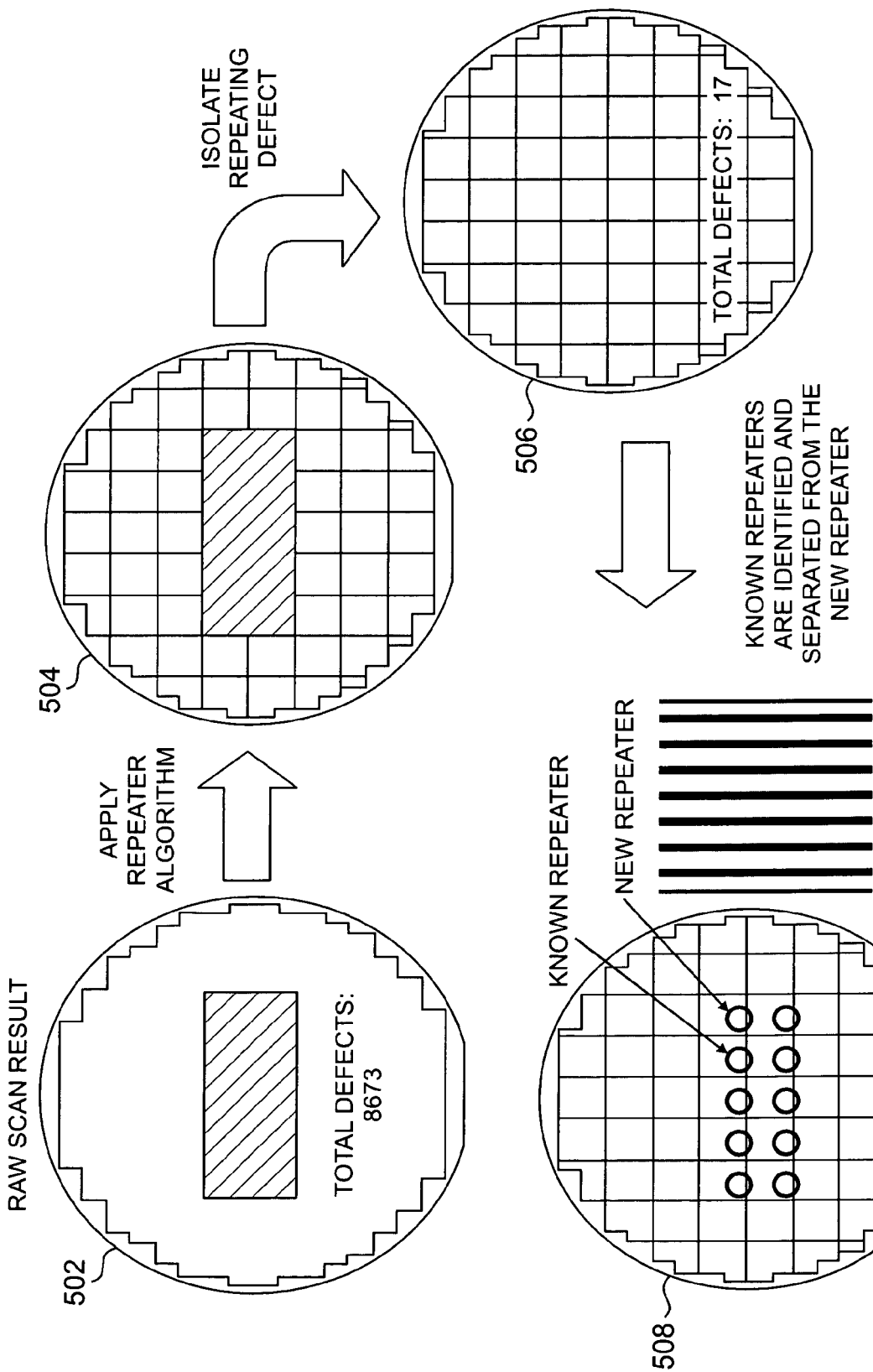
FIG. 5 illustrates a reticle repeater filtering process in accordance with a disclosed embodiment.

FIG. 5 illustrates a reticle repeater filtering process in accordance with a disclosed embodiment. A raw scan is taken at 502, and all defects are identified. A repeater algorithm is applied at 504, to identify repeating defects at 506. These results are stored, and thereafter, each repeating defect can be identified as a new repeater or a known repeater, at 508.

For each layer, once the haze-specific scan recipe is created, a wafer imprinted with a particular reticle is scanned and characterized to determine the baseline level of known repeater defects that are present on that reticle.

Each known repeater is then imaged, catalogued and the spatial coordinates of the repeater in relation to the shot grid are stored within a suitable software package, such as the HPL ODYSSEY software package, as a known repeater at that layer. This process is repeated for every reticle at that layer that is being used in production.

Once the known-repeater database is populated with data from all of the reticles, subsequent identification of new repeaters is performed automatically by the software package upon the completion of the wafer scan inspection. The software package will flag the presence of any repeater defect present on the scan result and differentiate between the known repeaters and new repeaters.

Reticle Clean Forecast System: Various embodiments also include a reticle clean forecast system. The system is based on reticle dose accumulation, where a dose counter is incremented each time the reticle is exposed on the steppers/scanners, and reticle production time, calculated from the first "in production" or last clean date. The system includes an automated real-time system which displays the reticle clean needs based on the above noted criteria. Based on this system, manufacturing and engineering groups can effectively create production plans.

The reticle clean forecast system, in some embodiments, ties in with two existing systems: SIMAX (Samsung Integrated Management And eXecution system) and ARMS (Advanced Reticle Management System), software products of Samsung Electronics of Korea.

In some embodiments, the reticle usage and historical data are initially stored on a UNIX production server. A copy of this information is transferred to a SQL server in order to maintain the integrity of the data on the production server. An ASP-coded web page dynamically displays the SQL database query results. The web page is an interface used for daily dose-based and time-based monitoring of reticle clean requirements.

Clean Forecast Process Flow: The process begins with the reticle inspection and registration within the ARMS web interface. The dose counting parameters are set at this time, and the dose-based and time-based calculations become active. The time-based calculation begins from the date the reticle is first placed in production.

Figure 6:
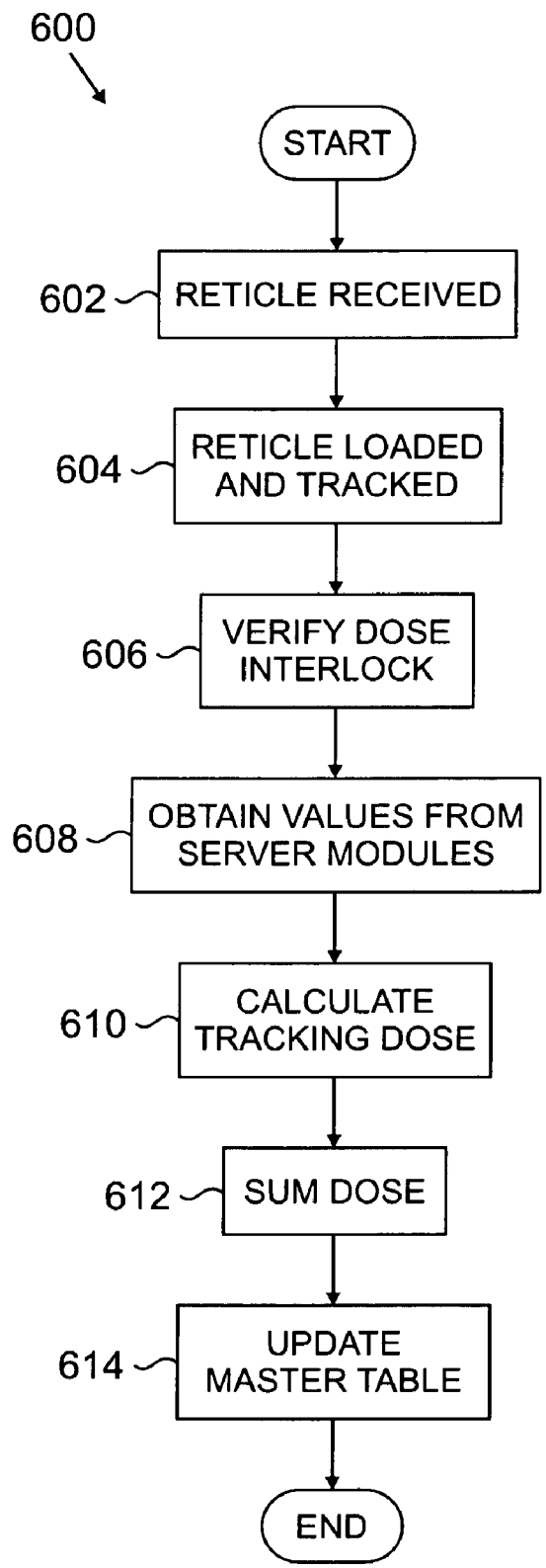
FIG. 6 depicts a flowchart of a dose-based process in accordance with some embodiments.

FIG. 6 depicts a flowchart of a dose-based process in accordance with some embodiments. First the reticle is received (step 602), for example from the mask shop, and inspected and registered into a management system such as ARMS. The initial dose tracking parameters are set at this time.

The reticle is requested, e.g., through an operator interface, and loaded into the tool (step 604). The lot is tracked into the tool, and the dose calculation coding is initiated.

The dose interlock is verified (step 606). If the dose interlock meets a predetermined threshold, then no calculation is performed.

Values are obtained from server modules (step 608). This can include the exposure time and number of wafers, the dose limit, current dose, and shots per wafer, and the tool time.

The tracking dose is calculated for this run (step 610), which can include the exposure time, number of wafers, shots per wafer, and tool adjustment factor.

The doses are summed (step 612), adding the newly calculated dose to the current dose.

The management system master table is updated with the dose information (step 614).

The reticle dose continues to accumulate each time the reticle is processed. A dynamic web page can be used for clean forecasting. The dose-based and time-based sections are displayed in sorted, color-coded and image-coded tables which present an "At-A-Glance" view of the reticle cleaning needs.

The four levels displayed on the forecasting screen, in some embodiments, are defined in the table below, but of course the values are exemplary only, and do not limit the scope of the disclosed embodiments. For displaying the information below, distinct colors and/or symbols can be used for each reticle condition.

| Dose Limit | Time Limit | Response |
| --- | --- | --- |
| >100% | >100% | Reticle is interlocked |
| 90%-100% | 93%-100% | Immediate reticle clean |
| 75%-89% | 83%-92% | Reticle clean requested |
| <75% | <83% | Production |

Once the reticles are cleaned, the information is submitted through the management system, such as ARMS, which prompts the resetting of the dose and time values. The reticles are then placed back in the production flow and continue through the reticle clean management cycle described in FIG. 7.

Figure 7:
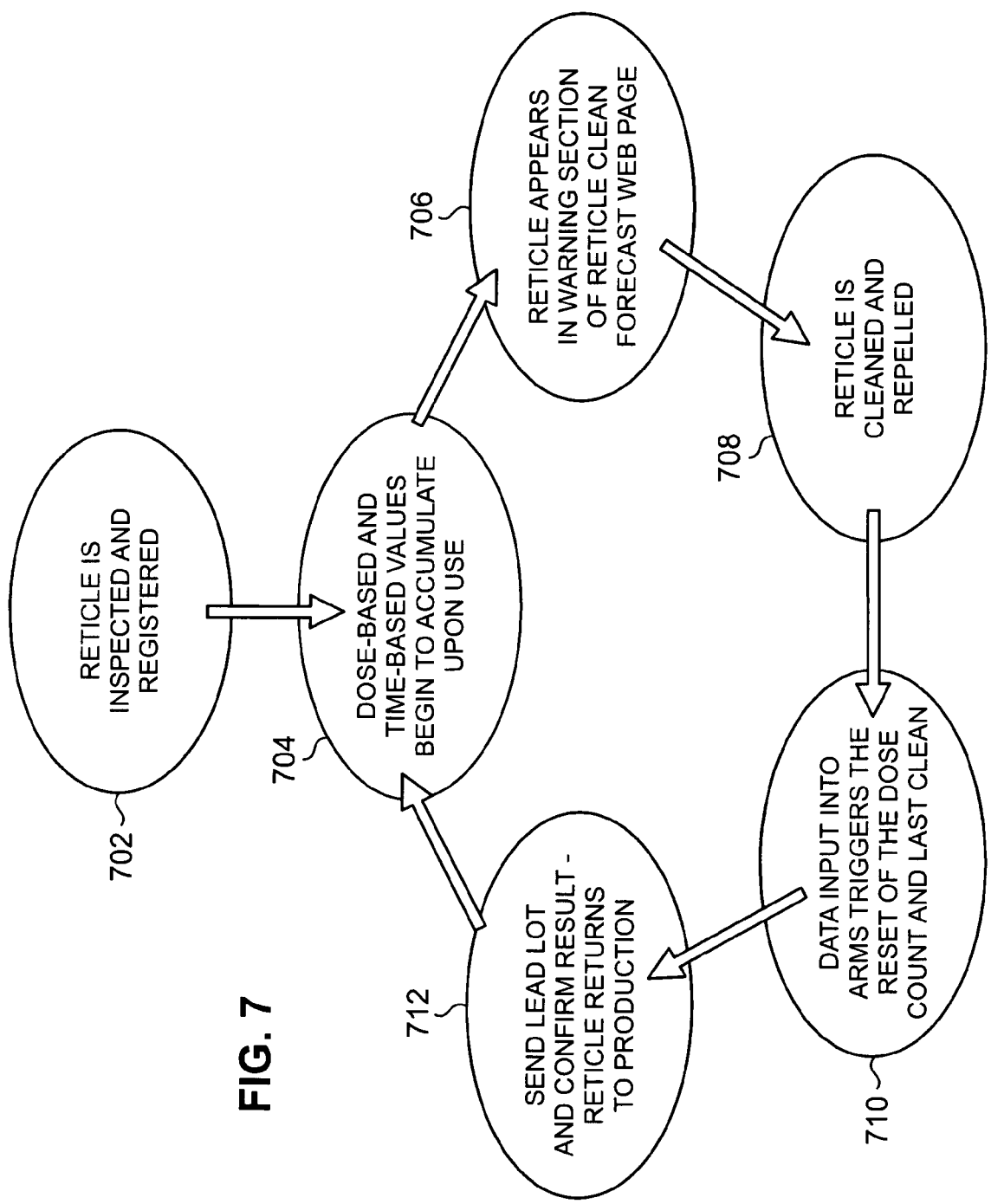
FIG. 7 depicts an exemplary reticle clean management cycle in accordance with various disclosed embodiments.

FIG. 7 depicts an exemplary reticle clean management cycle in accordance with various disclosed embodiments. Here the reticle is inspected and registered (step 702).

Dose-based and time-based values begin to accumulate upon the use of the reticle (step 704).

As the reticle is used, the reticle eventually appears in the warning section of a reticle clean forecast web page (step 706).

The reticle is cleaned and repelled (step 708). Data input into the management system, such as ARMS, triggers the reset of the dose count and last clean (step 710).

The system will send the lead lot and confirm the result, and the reticle is returned to production (step 712). The process returns to step 704.

The number of times that each reticle is cleaned is also documented in some embodiments. This data is used to replace the reticles that have approached their lifetime for cleans. The effectiveness of the dose-based and time-based specification limits is tracked, and adjustments can be made as needed as the process and other factors change. In many cases, the new device designs, new products, new processes, new tools and new environment will dictate the clean limit specification changes. The reticle clean forecasting system has been designed with the capability to react and adjust to those changes quickly and efficiently.

Various embodiments combine the use of the existing systems such as SIMAX and ARMS, together with known programming techniques and the innovations described herein to produce a dynamic, easy-to-read, tracking and planning tool for reticle clean needs.

Reticle cleaning system: For reticle cleaning, wet cleaning process tools are used to remove contaminants and haze defects from the surface of reticles. The extent of the cleaning depends on the severity of the defect. In some embodiments, a STEAG HAMATEC tool, known to those of skill in the art, is used primarily to remove contaminants from the glass side of reticles using wet chemicals. The spin-type method is used to dispense chemicals, rinse and thy. An AOC TECHNO tool, known to those of skill in the art, is mainly used in some embodiments as a final clean with the pellicle removed. Pellicle adhesive residue remaining on the edge of the reticles and haze defects are removed in this chemical cleaning process that uses the full reticle immersion technique.

In conventional systems, the reticle cleaning process is prone to adding contaminants to the reticles. The consistent failures in the post-clean qualification process deemed the cleaning system unreliable and inadequate to support the number of reticle cleans required by high volume wafer production. Disclosed embodiments provide a reliable and well-controlled reticle cleaning process by implementing several tool modifications and process developments to satisfy the strict requirements for reticle cleaning.

Some of the modifications made to the final clean equipment include conversions made mainly in the chemical distribution area to add a chemical supply system that pumps nanostrip directly from the subfab to the tool instead of from the fab-level chemical cabinet. Other modifications in some embodiments include the elimination of the SC 1 tank recirculation unit since it can add more contaminants to the process. Other modifications in some embodiments include altering the robot stop position mainly in the IPA and unload areas for better handling and contaminant control. Other modifications in some embodiments include adjusting the N2 bubbler lines from the process tanks to avoid route of contaminant entry.

In some embodiments, the best cleaning condition was found by increasing the SC1 time by 25% to neutralize the charging effects that might attract the small particles to the surface and tripling the DI water rinse time to compensate the possible impurities caused by increasing the SC1 time. This improvement can provide, in some implementations, the best cleaning process that can clean reticle without adding defects on the clear area.

In some embodiments, in order to maintain the best possible condition for the process recipe, several control measures have been applied.

A daily test reticle qualification is performed on the clean process. The daily process qualification helps establish the clean process base line, react to process changes and maintain the reliable clean process for production. A monthly failure analysis is performed to monitor sulfates and ammonium on the reticle surface with 2 reticle samplings. Further, a monthly concentration sampling for ammonium amount in the SC1 tank.

The embodiments and examples set forth herein are presented to best explain the present invention and its practical application and to thereby enable those skilled in the art to make and utilize the invention. However, those skilled in the art will recognize that the foregoing description and examples have been presented for the purpose of illustration and example only. The description as set forth is not intended to be exhaustive or to limit the invention to the precise form disclosed. Many modifications and variations are possible in light of the above teaching without departing from the spirit and scope of the following claims.

What is claimed is:

1. A haze forecasting method for haze control on a semiconductor reticle, comprising:
   scanning a plurality of semiconductor wafers;
   identifying repeating defects in the semiconductor wafers;
   storing the repeating defects in a database as known repeating defects; and
   using the repeating defects stored in the database to identify subsequent repeating defects as either a known repeating defect or a new repeating defect,
   wherein non-repeating defects in the semiconductor wafers are not stored in the database.

2. The method of claim 1, wherein the spatial coordinates of each repeating defect are stored.

3. The method of claim 1, wherein the repeating defects in the semiconductor wafers are identified by applying a repeater algorithm.

4. The method of claim 1, wherein known repeating defects and new repeating defects are differentiated from one another by the presence of a flag.

5. The method of claim 1, wherein storing the repeating defects in a database as known repeating defects comprises:
   storing an image of each known repeating defect; and
   cataloguing each known repeating defect.

6. The method of claim 1, wherein non-repeating defects are identified as false defects.

7. A method of reticle repeater filtering, comprising:
   taking a raw scan of a semiconductor wafer;
   applying a repeater algorithm to the raw scan to identify one or more repeating defects;
   classifying the identified one or more repeating defects as known repeating defects;
   storing the known repeating defects in a database; and
   using the database to classify subsequently identified repeating defects as either a known repeating defect or a new repeating defect,
   wherein non-repeating defects in the semiconductor wafer are not stored in the database.

8. The method of claim 7, wherein storing the known repeating defects in a database comprises:
   storing an image of each known repeating defect; and
   cataloguing each known repeater.

9. The method of claim 7 further comprising:
storing a spatial coordinate in relation to a shot grid for each known repeating defect.

10. The method of claim 7, wherein new repeating defects are differentiated from known repeating defects on the raw scan.

11. The method of claim 10, wherein new repeating defects are differentiated from known repeating defects on the raw scan by a flag.

12. The method of claim 7, wherein non-repeating defects are identified as false defects.

13. A method of filtering repeating reticle defects:
identifying one or more repeating defects in a raw scan of a semiconductor wafer;
storing the one or more identified repeating defects as known repeating defects; and
using the identified known repeating defects to classify a subsequently identified repeating defect as a known repeating defect or a new repeating defect,
wherein non-repeating defects in the semiconductor wafer are not stored.

14. The method of claim 13, wherein the one or more repeating defects in the raw scan are identified by applying a repeater algorithm to the raw scan.

15. The method of claim 13, wherein storing the one or more identified repeating defects as known repeating defects comprises:
storing an image of each known repeating defect in a database; and
cataloguing each known repeater in the database.

16. The method of claim 15 further comprising:
storing a spatial coordinate in relation to a shot grid for each known repeating defect.

17. The method of claim 13, wherein new repeating defects are differentiated from known repeating defects on the raw scan.

18. The method of claim 17, wherein new repeating defects are differentiated from known repeating defects on the raw scan by a flag.

19. The method of claim 13, wherein non-repeating defects are identified as false defects.

* * * * *